United States Patent [19]
Ashley et al.

[11] Patent Number: 6,141,783
[45] Date of Patent: Oct. 31, 2000

[54] ERROR PROPAGATION LIMITING ENCODER/DECODER FOR MULTILEVEL DECISION FEEDBACK EQUALIZATION

[75] Inventors: Jonathan James Ashley, Los Gatos; Mario Blaum, San Jose; Brian Harry Marcus, Los Altos; Constantin Michael Melas, Los Gatos, all of Calif.

[73] Assignee: International Business Machines Corporation, Armonk, N.Y.

[21] Appl. No.: 09/058,509

[22] Filed: Apr. 10, 1998

[51] Int. Cl.$^7$ ............................. G06F 11/00; G06F 11/30; H03M 13/00; H04L 1/00
[52] U.S. Cl. ......................... 714/746; 375/233; 375/296; 375/348; 341/59; 341/68
[58] Field of Search ..................................... 714/746, 758, 714/759; 341/59, 68, 69; 375/233, 341, 348, 350, 296, 285, 260, 261, 265, 316, 346, 349; 708/323; 370/206, 506

[56] References Cited

U.S. PATENT DOCUMENTS

| | | | |
|---|---|---|---|
| 4,413,251 | 11/1983 | Adler et al. .................................. | 341/59 |
| 5,003,555 | 3/1991 | Bergmans ................................. | 375/233 |
| 5,052,000 | 9/1991 | Wang et al. .............................. | 714/758 |
| 5,287,351 | 2/1994 | Wall, Jr. .................................... | 370/206 |
| 5,295,159 | 3/1994 | Kerpez ...................................... | 375/260 |
| 5,353,310 | 10/1994 | Russell et al. ........................... | 375/348 |
| 5,692,011 | 11/1997 | Nobakht et al. ......................... | 375/233 |
| 5,742,642 | 4/1998 | Fertner ..................................... | 375/233 |
| 5,748,674 | 5/1998 | Lim ......................................... | 375/233 |
| 5,777,692 | 7/1998 | Ghosh ...................................... | 348/725 |
| 5,881,108 | 3/1999 | Herzberg et al. ........................ | 375/296 |

OTHER PUBLICATIONS

Kenney, et al., "Multi–Level Decision Feedback Equalization: An Efficient Realization of FDTS/DF", 1995 IEEE; 0018–9464; pp. 1115–1120.

Kennedy et al., "Tight Bounds on the Error Probabilities of Decision Feedback Equalizers," IEEE Transactions on Communications, vol. COM–35, No. 10, Oct. 1987, 0090–6778; pp. 1022–1028.

Bednarz et al., "Performance Evaluation of an Adaptive RAM–DFE Read Channel," Preprint to appearl in IEEE Transactions on Magnetics, 1995; pp. 1–7.

Kenney et al., "Pipelining for Speed Doubling in MDFE", 1996 IEEE; 0–7803–3250–4; pp. 561–565.

Kenney et al., "Multi–level Decision Feedback Equalization for Saturation Recording," 1993 IEEE; 0018–9464; pp. 2160–2171.

Kennedy et al., "Recovery Times of Decision Feedback Equalize on Noiseless Channels," IEEE Transactions on Ccommunications, vol. COM–35, No. 10, Oct. 1987; pp. 1012–1021.

Duttweiler et al., "An Upper Bound on the Error Probability in Decision–Feedback Equalizaion," IEEE Transactions on Information Theory, vol. IT–20, No. 4, Jul. 1974; pp. 490–497.

*Primary Examiner*—Emmanuel L. Moise
*Attorney, Agent, or Firm*—Morgan & Finnegan LLP

[57] ABSTRACT

The present invention is an encoder and decoder that eliminate all infinitely propagating error sequences for many sets of taps. The encoder includes an input circuit operable to receive an unencoded data signal and an encoding circuit, coupled to the input circuit, operable to generate the encoded data signal using a code that eliminates infinitely propagating error sequences when the encoded data signal is recovered by a decision feedback equalizer data recovery channel. The decoder includes an input circuit operable to receive an encoded data signal and a decoding table, coupled to the input circuit, operable to generate the decoded data signal using a code that eliminates infinitely propagating error sequences when the encoded data signal is recovered by a decision feedback equalizer data recovery channel.

32 Claims, 6 Drawing Sheets

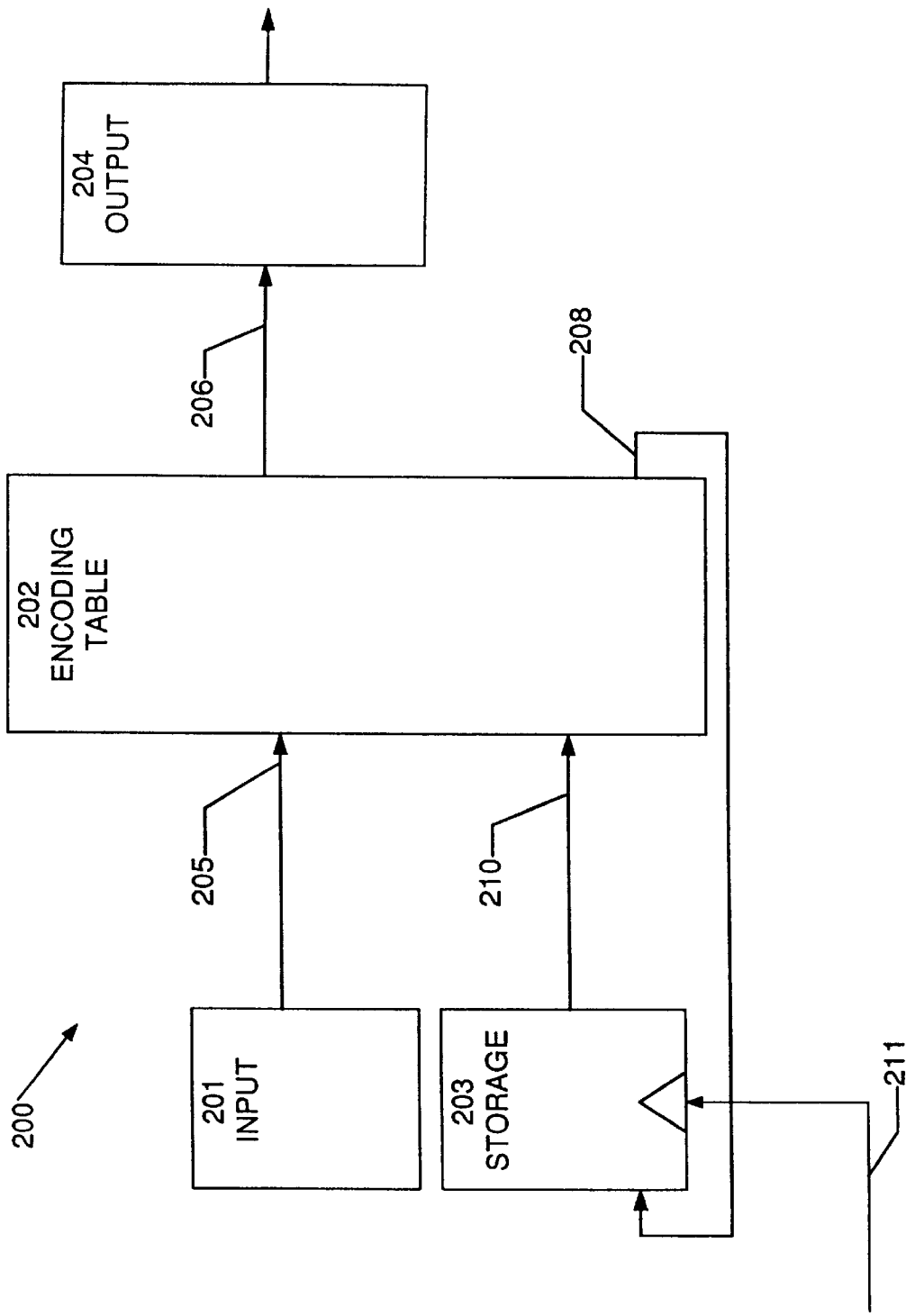

Fig. 3

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 10/5 | 10/3 | 10/0 | 10/8 | 11/6 | 11/3 | 11/1 | 12/C | 14/5 | 14/3 | 12/A | 10/B | 12/6 | 12/3 | 12/0 | 14/B |
| 1 | 10/5 | 10/3 | 10/0 | 10/8 | 11/6 | 11/3 | 14/0 | 14/8 | 14/5 | 14/3 | 12/A | 10/B | 12/6 | 12/3 | 12/0 | 14/B |
| 2 | 10/5 | 10/3 | 10/0 | 10/8 | 11/6 | 11/3 | 14/0 | 14/8 | 14/5 | 14/3 | 12/A | 10/B | 15/6 | 15/3 | 15/1 | 14/B |
| 3 | 04/5 | 04/3 | 04/0 | 04/8 | 01/6 | 01/3 | 01/1 | 02/A | 02/0 | 02/3 | 02/6 | 04/B | 05/6 | 05/7 | 05/1 | 02/C |
| 4 | 08/5 | 08/3 | 08/0 | 08/8 | 09/6 | 09/3 | 09/2 | 0A/6 | 0A/9 | 0A/3 | 0A/B | 08/B | 15/6 | 15/3 | 15/1 | 0A/0 |
| 5 | 08/5 | 08/3 | 08/0 | 08/8 | 09/6 | 09/3 | 09/2 | 00/4 | 0A/9 | 0A/3 | 0A/B | 08/B | 00/8 | 00/B | 00/0 | 0A/0 |
| 6 | 08/5 | 08/3 | 08/0 | 08/8 | 09/6 | 09/3 | 09/2 | 00/4 | 02/0 | 0A/3 | 0A/B | 08/B | 00/8 | 00/B | 00/0 | 00/3 |
| 7 | 04/5 | 04/3 | 04/0 | 04/8 | 01/6 | 01/3 | 01/1 | 02/A | 02/0 | 02/3 | 02/6 | 04/B | 15/6 | 15/3 | 15/1 | 02/C |
| 8 | 28/5 | 28/3 | 28/0 | 2A/9 | 29/6 | 29/3 | 29/2 | 20/4 | 2A/6 | 2A/3 | 2A/0 | 28/B | 20/8 | 20/B | 20/0 | 20/3 |
| 9 | 28/5 | 28/3 | 28/0 | 28/8 | 29/6 | 29/3 | 29/2 | 20/4 | 2A/6 | 2A/3 | 2A/0 | 28/B | 20/8 | 20/B | 20/0 | 20/3 |
| A | 28/5 | 28/3 | 28/0 | 28/8 | 29/6 | 29/3 | 29/2 | 20/4 | 22/0 | 22/3 | 22/6 | 28/B | 20/8 | 20/B | 20/0 | 20/3 |
| B | 24/5 | 24/3 | 24/0 | 22/A | 21/6 | 21/3 | 21/1 | 24/8 | 22/0 | 22/3 | 22/6 | 22/C | 25/6 | 25/7 | 25/1 | 24/B |
| C | 24/5 | 24/3 | 24/0 | 2A/9 | 21/6 | 21/3 | 21/1 | 24/8 | 2A/6 | 2A/3 | 2A/0 | 2A/B | 25/6 | 25/7 | 25/1 | 24/B |

Fig. 5

| | 00 | 01 | 02 | 04 | 05 | 08 | 09 | 0A | 10 | 11 | 12 | 14 | 15 | 20 | 21 | 22 | 24 | 25 | 28 | 29 | 2A |
|---|---|---|---|---|---|---|---|---|---|---|---|---|---|---|---|---|---|---|---|---|---|
| 00 | 4 | F | F | F | F | 7 | 7 | 7 | E | E | E | E | 7 | C | D | D | D | D | C | C | C |
| 01 | A | 5 | 5 | 5 | 5 | 4 | 4 | 4 | 6 | 6 | 6 | 6 |   | 7 | F | 7 | F | F | 7 | 7 | F |
| 02 | 0 | 9 | 9 | 9 | 9 | A | A | A | 8 | 8 | 8 | 8 | D | 3 | B | B | B | B | 3 | 3 | 3 |
| 04 | C | 1 | 1 | 1 |   | 0 | 0 | 0 | 2 | 2 | 2 | 2 | 6 | 3 | B | B | B | B | 3 | 3 | 3 |
| 05 | 0 | D | D | D | 1 | C | C | C | E | E | E | E |   | 8 | A | A | A | A | 8 | 8 | 8 |
| 08 | 4 | 1 | 1 | 1 | 1 | 0 | 0 | 0 | 2 | 2 | 2 | 2 |   | 3 | B | B | B | B | 3 | 3 | 3 |
| 09 | 7 | 5 | 5 | 5 | 5 | 4 | 4 | 4 | 6 | 6 | 6 | 6 | 7 | A | 7 | A | 7 | 7 | A | A | 7 |
| 0A | 0 | 9 | 9 | 9 | 9 | 7 | 7 | 7 | F | F | F | F |   | 7 | F | F | F | F | 7 | 7 | 7 |
| 10 | 4 | 1 | 1 | 1 | 1 | 0 | 0 | 0 | 2 | 2 | 2 | 2 |   | C | D | D | D | D | C | C | C |
| 11 | C | 5 | 5 | 5 | 5 | 4 | 4 | 4 | 6 | 6 | 6 | 6 | D | 3 | B | 3 | B | B | 3 | 3 | 3 |
| 12 | 8 | D | D | D | D | 8 | 8 | 8 | E | E | E | E | 6 | 7 | F | F | F | F | 7 | 7 | 7 |
| 14 | C | D | D | D | D | C | C | C | E | E | E | E |   | 3 | B | B | B | B | 3 | 3 | 3 |
| 15 |   | F | F | F | F | 7 | 7 | 7 | 2 | 2 | 2 | 2 |   | 3 | B | B | B | B | 3 | 3 | 3 |
| 20 | 4 | 1 | 1 | 1 | 1 | 0 | 0 | 0 | E | E | E | E |   | C | D | D | D | D | C | C | C |
| 21 | A | 5 | 5 | 5 | 5 | 4 | 4 | 4 | 2 | 2 | 2 | 2 |   | 7 | F | 7 | F | F | 7 | 7 | F |
| 22 | 0 | 9 | 9 | 9 | 9 | 0 | 0 | 0 | 6 | 6 | 6 | 6 |   | 3 | B | B | B | B | 3 | 3 | 3 |
| 24 | C | 1 | 1 | 1 | D | C | C | C | 2 | 2 | 2 | 2 |   | 3 | B | B | B | B | 3 | 3 | 3 |
| 25 | 0 | D | D | D | 1 | 0 | 0 | 0 | E | E | E | E |   | 8 | A | A | A | A | 8 | 8 | 8 |
| 28 | 4 | 1 | 1 | 1 | 1 | 4 | 4 | 4 | 2 | 2 | 2 | 2 |   | 3 | B | B | B | B | 3 | 3 | 3 |
| 29 | 8 | 5 | 5 | 5 | 5 | 4 | 4 | 4 | 6 | 6 | 6 | 6 |   | 3 | B | B | B | B | 3 | 3 | 3 |
| 2A | 4 | 9 | 9 | 9 | 9 | 8 | 8 | 8 | A | A | A | A |   | 3 | B | B | B | B | 3 | 3 | 3 |

ERROR PROPAGATION LIMITING ENCODER/DECODER FOR MULTILEVEL DECISION FEEDBACK EQUALIZATION

FIELD OF THE INVENTION

The present invention relates to an encoder and decoder which limit error propagation in multilevel decision feedback equalization.

BACKGROUND OF THE INVENTION

Decision Feedback Equalization (DFE) is a well-known scheme used to detect signals transmitted across communications and recording channels with intersymbol interference. In DFE, a forward equalizer shapes the readback pulse in a desired way and a feedback equalizer attempts to cancel the intersymbol interference. However, a problem arises with DFE, in that the feedback mechanism has the potential to cause long bursts of errors.

The version of DFE called Multilevel Decision Feedback Equalization (MDFE), described by J. G. Kenney, L. R. Carley and R. Wood in the article "Multi-level Decision Feedback Equalization for Saturation Recording," EEE Transaction on Magnetics, vol. 19, no. 4, pp. 2160–71, July 1993, has several advantages when used in magnetic recording. In MDFE, the channel is equalized into a linear channel on non-return to zero (NRZ) (i.e. ±1) sequences defined by dibit response with a main lobe of positive taps $a_0$, $a_1$, $a_2$ and a tail of negative taps $-a_3, -a_4, -a_5, \ldots, -a_L$. The feedback equalizer attempts to cancel the negative taps. According to the formulation by J. L. Kenney and C. M. Melas in the article "Pipelining for Speed Doubling in MDFE," Conference Proceedings of the ICC '96, it is required that $a_1 > a_0 = a_2$, yielding signal levels $\pm(a_1+2a_0)$, $\pm a_1$, $\pm(a_1-2a_0)$. After cancellation, a threshold detector, with threshold =0, makes the bit decision. This would not work if the lowest level, $a_1-2a_0$, were very small or negative, so the data sequences are constrained to eliminate that level. This is accomplished by imposing a d=1 run length limited constraint (which forbids the NRZ patterns 1 −1 1 and −1 1 −1). An upper run length limit is also imposed for purposes of timing control. Typically a standard rate 2:3 (d, k)=(1, 7) run length code is used.

For many sets of taps, a standard (1, 7) code, such as that described in U.S. Pat. No. 4,413,251 to Adler et al., admit infinitely propagating error sequences. These are sequences that, as a result of an initial error, can cause infinitely many errors, even in the absence of further noise. Such sequences are among the primary causes of error rate degradation in the MDFE scheme, especially in the region of high signal-to-noise ratio. A need arises for a scheme that eliminates all infinitely propagating error sequences for many sets of taps.

SUMMARY OF THE INVENTION

The present invention is an encoder and decoder that eliminate all infinitely propagating error sequences for many sets of taps. The encoder includes an input circuit operable to receive an unencoded data signal and an encoding circuit, coupled to the input circuit, operable to generate the encoded data signal using a code that eliminates infinitely propagating error sequences when the encoded data signal is recovered by a decision feedback equalizer data recovery channel. The decoder includes an input circuit operable to receive an encoded data signal and a decoding table, coupled to the input circuit, operable to generate the decoded data signal using a code that eliminates infinitely propagating error sequences when the encoded data signal is recovered by a decision feedback equalizer data recovery channel.

An NRZ sequence can be described as a run length sequence $r_1 r_2 r_3 \ldots$, where each $r_k$ represents a run of +1's or a run of −1's of length $r_k$. This description is used below. The NRZI sequence corresponding to an NRZ sequence is the sequence of 0's and 1's, in which a "1" represents a change from a −1 to a +1 or a change from a +1 to a −1 in the NRZ sequence, and in which a "0" represents an absence of such a change.

In one embodiment, the code further has a lower run length limit of one (i.e. eliminates 1 −1 1 and −1 1 −1, in NRZ) and eliminates infinitely propagating error sequences when the encoded data is recovered by a multi-level decision feedback equalizer data recovery channel. In another embodiment, the code further eliminates, from the encoded data, run length sequences involving short run lengths. In another embodiment, the code further eliminates, from the encoded data, terminating run-length sequences of the form $r_i 2 \; r_{i+2} \; 2 \; r_{i+4} \; 2 \; r_{i+6} \ldots$, where each $r_k \leq 4$. In another embodiment, the code further eliminates, from the encoded data, terminating run length sequences of the form $r_i \; 2 \; r_{i+2} \; 2 \; r_{i+4} \; 2 \; r_{i+6} \ldots$, where each $r_k$ is selected from a set consisting of 3 and 4, and also eliminates, from the encoded data, terminating run-length sequences of the form 2 2 2 2 2 2 . . . . In another embodiment, a particular code, which is set forth below, is used.

BRIEF DESCRIPTION OF THE DRAWINGS

The details of the present invention, both as to its structure and operation, can best be understood by referring to the accompanying drawings, in which like reference numbers and designations refer to like elements.

FIG. 2 is a block diagram of an encoder 200, which generates an encoded datastream.

FIG. 3 shows a preferred embodiment of a (d, k)=(1, 12) code that is used in the encoder of FIG. 2

FIG. 5 shows the decoding table of the decoder shown in FIG. 4.

DETAILED DESCRIPTION OF THE INVENTION

The present invention is an encoder and a decoder that use modulation codes that eliminate all infinitely propagating error sequences for many sets of taps. The choice of taps is determined based on several factors, such as circuit complexity, signal energy and noise enhancement.

A modulation code, according to the present invention, prevents infinite error propagation and lowers the probability of long burst errors. In particular, such a code significantly lowers the probability of consecutive byte errors, thereby lessening the burden on the outer error correcting code (ECC). This allows the degree of ECC interleaving to be reduced, or it allows information redundancy in a single interleave to be reduced, or it allows the channel bit period to be reduced. In any case, the information density is increased.

Figure 1A:
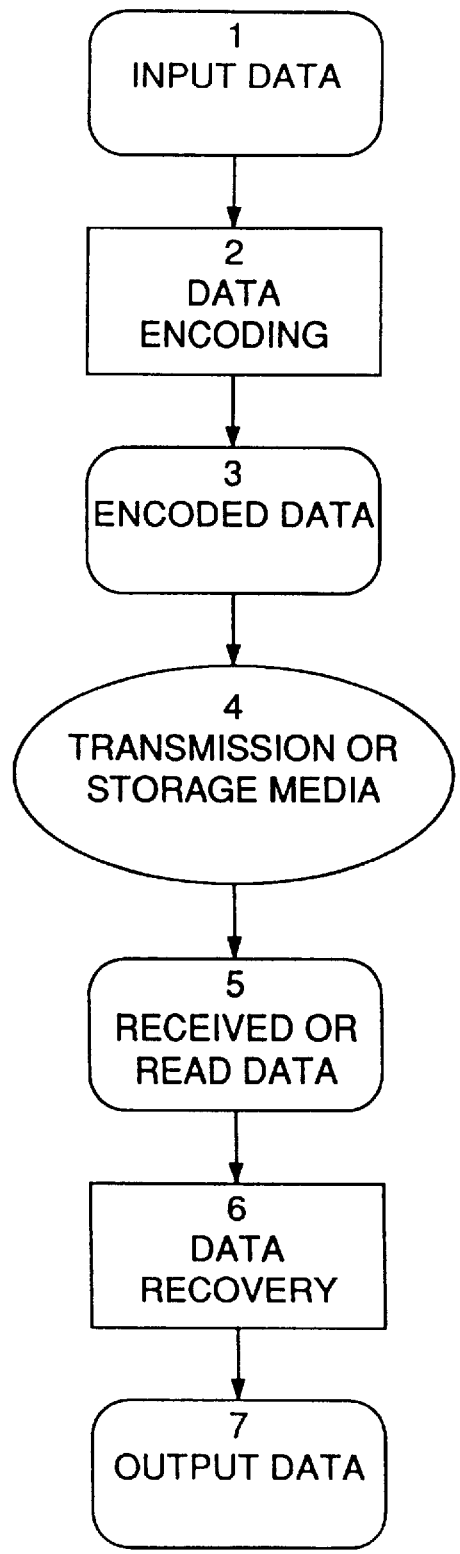
FIG. 1a is an exemplary block diagram of a data storage or transmission system.

An exemplary data storage or transmission system is shown in FIG. 1a. Input data 1 is received and encoded by data encoding block 2. The encoded data 3 is then transmitted through or recorded on transmission or storage media 4. Typical transmission media include radio frequency transmissions, coaxial cable, fiber optic cable, etc. Typical storage media include magnetic disk or tape, optical disk, magneto-optic disk, etc. The data is received from the transmission media or read from the storage media. The received or read data 5 is recovered in data recovery block 6. As part of the data recovery process, the encoded data is decoded to form output data 7, which is identical to input data 1, if there were no errors.

Figure 1B:
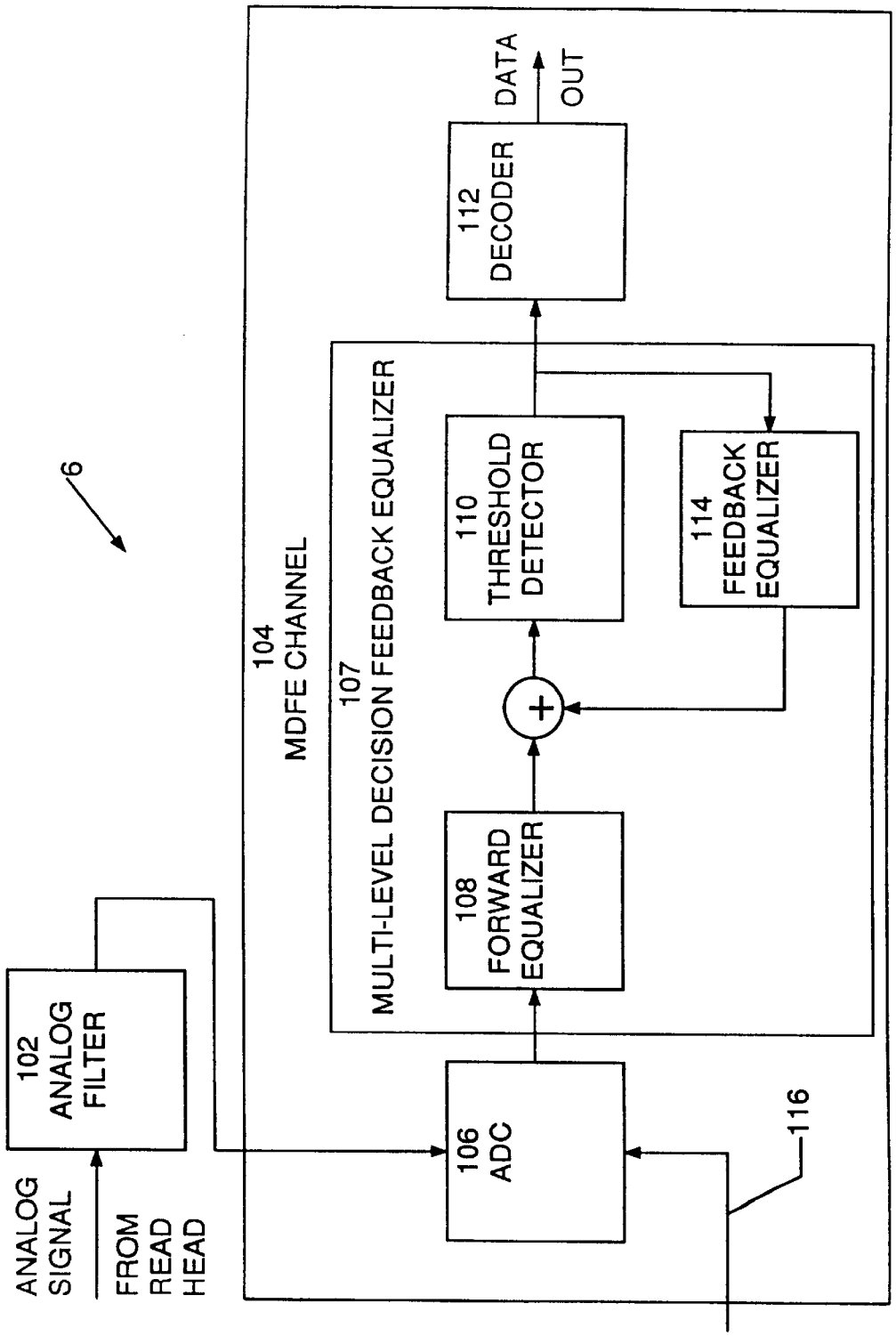
FIG. 1b is a block diagram of a data recovery circuit with multi-level decision feedback equalization (MDFE), according to the present invention.

A data recovery circuit 6 with multi-level decision feedback equalization (MDFE), according to the present invention, is shown in FIG. 1b. Such a circuit is typically used to recover data from a magnetic media or a communication channel. In a preferred embodiment, the circuit is used in a hard disk drive. The analog signal from the read head is filtered by analog filter 102. The filtered analog signal is then applied to digital detection channel 104. Digital detection channel 104 includes an analog to digital converter (ADC) 106, a forward equalizer 108, threshold detector 110, decoder 112 and feedback equalizer 114. ADC 106 samples the analog read signal at timing intervals defined by sample clock signal 116. The sampled read signal for digital detection channel 104 is equalized by forward equalizer 108. The binary data is detected by the threshold detector, 110 and input to decoder 112, which generates the final output data from the read circuit.

The forward equalizer 108 shapes the readback pulse response to a desired form, striking a compromise among preserving signal energy, limiting intersymbol interference and mitigating noise boost. Denote the pulse response by $$y_i = a_0 x_{i+1} + a_1 x_i + a_2 x_{i-1} - a_3 x_{i-2} - a_4 x_{i-3} - \ldots - a_L x_{i-L+1},$$

where each $a_k \geq 0$.

Here the x-values represent the input signal in NRZ (i.e., each $x_i$ is either +1 or −1); the a-values are called taps. The threshold detector makes estimates $\hat{x}_i$ of $x_i$ as follows: using previous estimates, the feedback equalizer computes:

$$e_i = a_3 \hat{x}_{i-2} + a_4 \hat{x}_{i-3} + \ldots + a_L \hat{x}_{i-L+1}$$

and adds $e_i$ to the received signal $y_i$ at the output of the forward equalizer; the threshold detector makes its estimate according to the rule:

$$\hat{x}_i = \text{Sign}(y_i + e_i)$$

The d=1 code constraint and the condition that $a_0 = a_2$ guarantee that if there were no noise then the detector would recover the input signal perfectly.

In MDFE, long run lengths tend to stop error propagation. Thus, infinitely propagating error sequences must terminate in a sequence of "short" run lengths. Of particular interest are tap sets whose infinitely propagating error sequences terminate in run length sequences of one of the following types:

R1: $r_i 2 r_{i+2} 2 r_{i+4} 2 r_{i+6} \ldots$, where each $r_k \in \{3, 4\}$

R2: 2 2 2 2 2 2 ...

For any set of taps satisfying the robust conditions T1–6 below, any infinitely propagating sequence must terminate in one of the forms R1 or R2.

T1: $a_1 > a_0 = a_2$ (the essential MFDE condition)

T2: $a_5 \geq a_6 \geq a_7 \ldots$

T3: $a_3 + a_6 + a_7 + a_8 + \ldots + a_L < (a_1 + 2a_0)/2$

T4: $a_4 + a_7 + a_8 + a_9 + \ldots + a_L < (a_1 + 2a_0)/2$

T5: $a_5 + a_6 + a_7 + \ldots + a_L < (a_1 + 2a_0)/2$

T6: $a_5 + a_7 + a_{10} + a_{11} + a_{12} + \ldots + a_L < a_1/2$

This is a reasonable set of conditions imposed on the taps. Conditions T3, T4 and T5 are conditions on the tail relative to the high signal level, $a_1 + 2a_0$. Condition T6 is a condition on the tail relative to the low signal level, $a_1$.

For ease of explanation, the actual constraint satisfied by the new modulation code is described in NRZI, rather than NRZ. The encoded sequences of the new modulation codes satisfy the constraint that they do not contain as a subword any of the following forbidden patterns F1–6:

F1: 11

F2: 0000000000000 (i.e., a run of 13 0's)

F3: 101010101010101 (i.e., a run of 2222222)

F4: 101000101000101 (i.e., a run of 24242)

F5: 10100101000101 (i.e., a run of 23242)

F6: 101001010010100101001 (i.e., a run sequence of 23232323)

Patterns F1 and F2 correspond to the (d, k)=(1, 12) run length limited constraint. In view of R1 and R2 above, patterns F3–6 suffice to eliminate all infinitely propagating sequences for taps satisfying conditions T1–6.

An encoder 200, which generates an encoded datastream, according to the present invention, is shown in FIG. 2. In a preferred embodiment, a (d, k)=(1, 12) run length limited (RLL) code is used to encode the signal recorded on the hard drive. The preferred code operates at a rate of 4:6. It is just as efficient as the standard (1, 7) codes and sacrifices very little in regard to timing control. Encoder 200 is preferably implemented in hardware as a finite state machine, but other hardware implementations, as well as software implementation, are also possible. Encoder 200 includes input block 201, encoding table 202, storage block 203 and output block 204. Encoder 200 outputs an encoded six bit string for every four bit group input. Input block 201 receives unencoded data groups and transmits them to input 205 of encoding table 202. Encoded data strings are output from encoding table 202 by output 206 to output block 204, which outputs the encoded data strings from the encoder. Next state information, which are four bit values, is output from encoding table 202 from output 208. Storage block 203 stores the current state of the encoder and outputs it to input 210 of encoding table 202. The next state, from output 208, is stored in storage block 203 as controlled by storage clock 211. Once stored, the next state becomes the current state.

A preferred embodiment of an encoding table 202, which causes encoder 200 to generate data encoded with a preferred (d, k)=(1, 12) code, is shown in FIG. 3. The row input values are received from input 210, while the column input values are received from input 205. The entries 212 are of the form c/s, where c is the 6-bit output string, output from output 206, and s is the next state, output from output 208. All values are written in hexadecimal. Values that are not used are omitted. Encoding table 202 may be implemented as a memory device, such as a ROM or a RAM, or encoding table 202 may be implemented as discrete logic. If Encoder 200 is implemented in software, encoding table 202 is typically stored in RAM.

Figure 4:
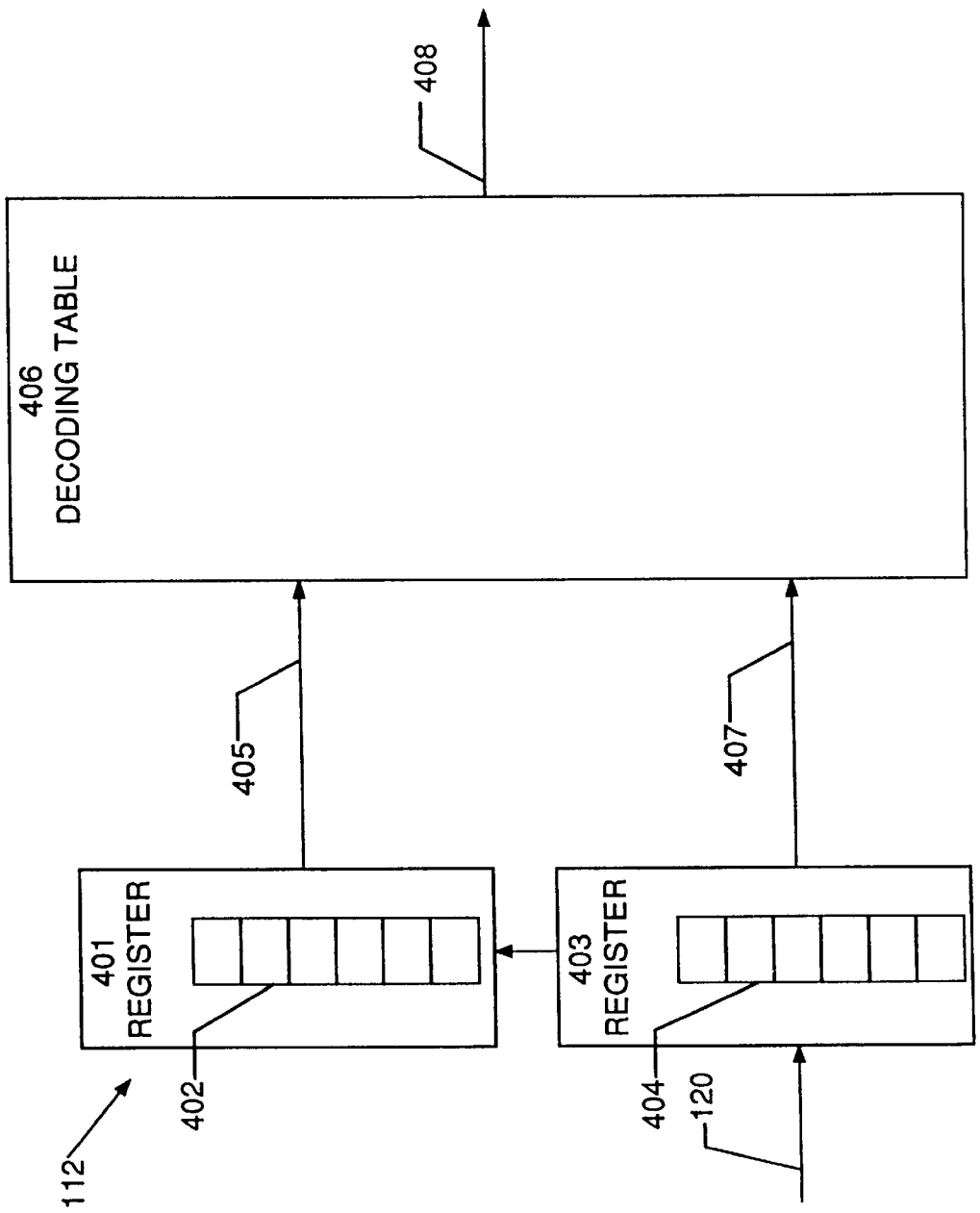
FIG. 4 is a block diagram of a decoder, shown in FIG. 1b, which decodes a datastream encoded with the code shown in FIG. 3.

A decoder 112, shown in FIG. 1b, which decodes a datastream encoded with the (d, k)=(1, 12) code shown in FIG. 3, is shown in FIG. 4. Decoder 112 is preferably implemented in hardware, but software implementation is also possible. Register 401 stores the six-bit string 402 currently being decoded. Register 403 stores the six-bit string 404 to be decoded next. Two storage registers are needed because two six-bit strings are used to generate each four-bit output group. The current string 402 in register 401 is applied to input 405 of decoding table 406 and the next string 404 in register 403 is applied to input 407 of decoding table 406. Decoded four-bit groups are output from decoding table 406 on output 408. The six bit binary data output 120 is input to storage register 403. After each four-bit group is output, the six-bit string 404 stored in register 403 replaces the string stored in register 401 and a new string is stored in register 403.

A preferred embodiment of a decoding table 406, which decodes the encoded data generated using the encoding table shown in FIG. 3, is shown in FIG. 5. The row input values are received from input 405, the current string, while the column input values are received from input 407, the next string. The table entries are the 4-bit output groups, which are output from output 408. All values are written in hexadecimal. Combinations that cannot occur are omitted. Decoding table 406 may be implemented as a memory device, such as a ROM or a RAM, or decoding table 406 may be implemented as discrete logic. If decoder 112 is implemented in software, decoding table 406 is typically stored in RAM.

Although specific embodiments of the present invention have been described, it will be understood by those of skill in the art that there are other embodiments that are equivalent to the described embodiments. Accordingly, it is to be understood that the invention is not to be limited by the specific illustrated embodiment, but only by the scope of the appended claims.

What is claimed is:

1. An encoder for generating encoded data signals, comprising:

an input circuit operable to receive an unencoded data signal; and an encoding circuit, coupled to the input circuit, operable to generate the encoded data signal using a code that eliminates infinitely propagating error sequences when the encoded data signal is recovered by a decision feedback equalizer data recovery channel.

2. The encoder of claim 1, wherein the code further has a lower run length limit of one and eliminates infinitely propagating error sequences when the encoded data is recovered by a multi-level decision feedback equalizer data recovery channel.

3. The encoder of claim 2, wherein the code has no terminating run length sequences of the form $r_i\ r_{i+1}\ r_{i+2}\ r_{i+3}\ r_{i+4}\ r_{i+5}\ r_{i+6}\ \ldots$, wherein each $r_k$ is less than a predefined integer.

4. The encoder of claim 3, wherein the code has no terminating run length sequences of the form $r_i\ 2\ r_{i+2}\ 2\ r_{i+4}\ 2\ r_{i+6}\ \ldots$, wherein each $r_k \leq 4$.

5. The encoder of claim 4, wherein the code has no terminating run length sequences of the form $r_i\ 2\ r_{i+2}\ 2\ r_{i+4}\ 2\ r_{i+6}\ \ldots$, wherein each $r_k$ is selected from a set consisting of 3 and 4; and the code has no terminating run length sequences of the form 2 2 2 2 2 2 . . .

6. The encoder of claim 1, wherein the encoding circuit comprises:

a state storage device, operable to store and output a signal representing a current state of the encoder, the current state signal having four bits, and having an input operable to accept a four bit next state signal; and an encoding table having a first input, a second input, a first output, and a second output, wherein the first input is operable to accept a current four bit group of the unencoded data signal, the second input is operable to accept the current state signal, the first output is operable to output a six bit string of the encoded data signal, and the second output is operable to output the next state signal, wherein column values are input on the first input and row values are input on the second input.

7. A circuit for generating decoded data signals, comprising:

an analog to digital converter, coupled to an analog signal representing encoded data, operable to generate a digital signal representing the analog signal;

a decision feedback equalizer, comprising a forward equalizer, coupled to the digital signal, operable to generate an equalized digital signal, a threshold detector, coupled to the equalized digital signal and a feedback signal, operable to generate a data signal, and a feedback equalizer, coupled to the data signal, operable to generate the feedback signal; and a decoder, coupled to the data signal, operable to generate a decoded data signal;

wherein the encoded data is encoded using a code that eliminates infinitely propagating error sequences.

8. The circuit of claim 7, wherein the decision feedback equalizer is a multi-level decision feedback equalizer and the code has a lower run length limit of one.

9. The circuit of claim 8, wherein the code has no terminating run length sequences of the form $r_i\ r_{i+1}\ r_{i+2}\ r_{i+3}\ r_{i+4}\ r_{i+5}\ r_{i+6}\ \ldots$, wherein each $r_k$ is less than a predefined integer.

10. The circuit of claim 9, wherein the code has no terminating run length sequences of the form $r_i\ 2\ r_{i+2}\ 2\ r_{i+4}\ 2\ r_{i+6}\ \ldots$, wherein each $r_k \leq 4$.

11. The circuit of claim 10, wherein:

the code has no terminating run length sequences of the form $r_i\ 2\ r_{i+2}\ 2\ r_{i+4}\ 2\ r_{i+6}\ \ldots$, wherein each $r_k$ is selected from a set consisting of 3 and 4; and the code has no terminating run length sequences of the form 2 2 2 2 2 2 . . .

12. The circuit of claim 8, wherein the decoder comprises:

a decoding table having a first input, a second input, and an output, wherein the first input is operable to accept a current six bit string of the data signal, the second input is operable to accept a next six bit string of the data signal, and the output is operable to output a four bit group of the decoded data signal, wherein row values are input on the first input and column values are input on the second input.

13. A decoder for decoding encoded data signals, comprising:

an input circuit operable to receive an encoded data signal; and a decoding table, coupled to the input circuit, operable to generate the decoded data signal using a code that eliminates infinitely propagating error sequences when the encoded data signal is recovered by a decision feedback equalizer data recovery channel.

14. The decoder of claim 13, wherein the code further has a lower run length limit of one and eliminates infinitely propagating error sequences when the encoded data is recovered by a multi-level decision feedback equalizer data recovery channel.

15. The decoder of claim 14, wherein the code has no terminating run length sequences of the form $r_i$ $r_{i+1}$ $r_{i+2}$ $r_{i+3}$ $r_{i+4}$ $r_{i+5}$ $r_{i+6}$ . . . , wherein each $r_k$ is less than a predefined integer.

16. The decoder of claim 15, wherein the code has no terminating run length sequences of the form $r_i$ 2 $r_{i+2}$ 2 $r_{i+4}$ 2 $r_{i+6}$ . . . , wherein each $r_k \leq 4$.

17. The decoder of claim 16, wherein:
the code has no terminating run length sequences of the form $r_i$ 2 $r_{i+2}$ 2 $r_{i+4}$ 2 $r_{i+6}$ . . . , wherein each $r_k$ is selected from a set consisting of 3 and 4; and
the code has no terminating run length sequences of the form 2 2 2 2 2 2 . . .

18. The decoder of claim 14, wherein the decoding table comprises:
a first input operable to accept a current six bit string of the encoded data signal;
a second input operable to accept a next six bit string of the encoded data signal; and
an output operable to output a four bit group of the decoded data signal, wherein row values are input on the first input and column values are input on the second input.

19. A data storage or transmission system comprising:
an input circuit operable to receive an unencoded data signal;
an encoding circuit, coupled to the input circuit, operable to generate the encoded data signal using a code;
a data transmission or storage media operable to receive the encoded data signal, store or transmit the encoded data signal and output a received encoded data signal;
a decision feedback equalizer data recovery channel operable to receive the received encoded data signal and output a recovered encoded data signal; and
a decoding circuit, operable to receive the recovered encoded data signal and generate a decoded data signal using the code;
wherein the code eliminates infinitely propagating error sequences.

20. The system of claim 19, wherein the decision feedback equalizer data recovery channel is a multi-level decision feedback equalizer data recovery channel and the code further has a lower run length limit of one.

21. The system of claim 20, wherein the code has no terminating run length sequences of the form $r_i$ $r_{i+1}$ $r_{i+2}$ $r_{i+3}$ $r_{i+4}$ $r_{i+5}$ $r_{i+6}$ . . . , wherein each $r_k$ is less than a predefined integer.

22. The system of claim 21, wherein the code has no terminating run length sequences of the form $r_i$ 2 $r_{i+2}$ 2 $r_{i+4}$ 2 $r_{i+6}$ . . . , wherein each $r_k \leq 4$.

23. The system of claim 22, wherein
the code has no terminating run length sequences of the form $r_i$ 2 $r_{i+2}$ 2 $r_{i+4}$ 2 $r_{i+6}$ . . . , wherein each $r_k$ is selected from a set consisting of 3 and 4; and
the code has no terminating run length sequences of the form 2 2 2 2 2 2 . . .

24. The system of claim 19, wherein the encoding circuit comprises:
a state storage device, operable to store and output a signal representing a current state of the encoder, the current state signal having four bits, and having an input operable to accept a four bit next state signal; and
an encoding table having a first input, a second input, a first output, and a second output, wherein the first input is operable to accept a current four bit group of the unencoded data signal, the second input is operable to accept the current state signal, the first output is operable to output a six bit string of the encoded data signal, and the second output is operable to output the next state signal, wherein column values are input on the first input and row values are input on the second input.

25. The system of claim 24, wherein the decoding circuit comprise:
a first input operable to accept a current six bit string of the encoded data signal;
a second input operable to accept a next six bit string of the encoded data signal; and
an output operable to output a four bit group of the decoded data signal, wherein row values are input on the first input and the column values are input on the second input.

26. A method of storing or transmitting data comprising the steps of:
receiving an unencoded data signal;
encoding the unencoded data signal to form an encoded data signal using a code;
storing the encoded data signal in a data storage media or transmitting the encoded data signal into a data transmission media;
receiving a stored or transmitted encoded data signal from the data storage or transmission media;
recovering a recovered encoded data signal from the stored or transmitted encoded data signal using a decision feedback equalizer data recovery channel; and
decoding the recovered encoded data signal to generate a decoded data signal using the code;
wherein the code eliminates infinitely propagating error sequences.

27. The method of claim 26, wherein the decision feedback equalizer data recovery channel is a multi-level decision feedback equalizer data recovery channel and the code further has a lower run length limit of one.

28. The method of claim 27, wherein the code has no terminating run length sequences of the form $r_i$ $r_{i+1}$ $r_{i+2}$ $r_{i+3}$ $r_{i+4}$ $r_{i+5}$ $r_{i+6}$ . . . , wherein each $r_k$ is less than a predefined integer.

29. The method of claim 28, wherein the code has no terminating run length sequences of the form $r_i$ 2 $r_{i+2}$ 2 $r_{i+4}$ 2 $r_{i+6}$ . . . , wherein each $r_k \leq 4$.

30. The method of claim 29, wherein
the code has no terminating run length sequences of the form $r_i$ 2 $r_{i+2}$ 2 $r_{i+4}$ 2 $r_{i+6}$ . . . , wherein each $r_k$ is selected from a set consisting of 3 and 4; and
the code has no terminating run length sequences of the form 2 2 2 2 2 2 . . .

31. The method of claim 26, wherein the encoding step comprises the steps of:
storing a four bit signal representing a current state of the encoder, the current state signal having four bits;
outputting a six bit string of the encoded data signal based on the current state signal and on a four bit group of the unencoded data signal, wherein column values correspond to the group of the unencoded data signal and row values correspond to the current state signal;

outputting a four bit next state signal based on the current state signal and on a four bit group of the unencoded data signal, wherein the column values correspond to the group of the unencoded data signal and the row values correspond to the current state signal; and storing the next state signal to form a new current state signal.

32. The method of claim 31, wherein the decoding step comprises the step of:

outputting a four bit group of the decoded data signal based on a current six bit string of the encoded data signal and on a next six bit string of the encoded data signal, wherein the row values correspond to the current string of the encoded data signal and the column values correspond to the next string of the encoded data signal.

* * * * *